(12) United States Patent
Prall et al.

(10) Patent No.: US 6,812,512 B2
(45) Date of Patent: Nov. 2, 2004

(54) INTEGRATED CIRCUIT HAVING SELF-ALIGNED CVD-TUNGSTEN/TITANIUM CONTACT PLUGS STRAPPED WITH METAL INTERCONNECT AND METHOD OF MANUFACTURE

(75) Inventors: Kirk Prall, Boise, ID (US); Howard E. Rhodes, Boise, ID (US); Sujit Sharan, Boise, ID (US); Gurtel Sandhu, Boise, ID (US); Philip J. Ireland, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/832,272

(22) Filed: Apr. 10, 2001

(65) Prior Publication Data

US 2001/0019893 A1 Sep. 6, 2001

Related U.S. Application Data

(62) Division of application No. 09/447,981, filed on Nov. 23, 1999, now Pat. No. 6,686,288, which is a continuation of application No. 08/994,950, filed on Dec. 19, 1997, now Pat. No. 5,990,021, which is a division of application No. 08/604,344, filed on Feb. 21, 1996, now abandoned.

(51) Int. Cl.$^7$ .............................................. H01L 27/108
(52) U.S. Cl. ..................... 257/296; 257/298; 257/306; 257/753; 257/767; 257/773; 257/915
(58) Field of Search ................................ 257/296, 298, 257/306, 753, 767, 768, 773, 774, 915

(56) References Cited

U.S. PATENT DOCUMENTS 5,032,530 A    7/1991  Lowrey et al.
5,134,085 A    7/1992  Gilgen et al.
5,192,589 A    3/1993  Sandhu
5,254,872 A   10/1993  Yoda et al.
5,280,190 A    1/1994  Lu
5,323,038 A *  6/1994  Gonzalez et al. ........... 257/308
5,338,700 A    8/1994  Dennison et al.
5,525,543 A *  6/1996  Chen ........................... 437/190
5,545,592 A *  8/1996  Iacoponi ...................... 438/655
5,561,623 A * 10/1996  Ema ............................. 365/51
5,565,708 A * 10/1996  Ohsaki et al. ............... 257/764
5,629,539 A *  5/1997  Aoki et al. ................... 257/302
5,696,017 A   12/1997  Ueno
5,712,509 A *  1/1998  Harada et al. ............... 257/758
5,846,881 A   12/1998  Sandhu et al.
5,874,756 A    2/1999  Ema et al.
5,929,526 A    7/1999  Srinivasan
5,981,330 A   11/1999  Jeng
5,985,756 A   11/1999  Shinmura
6,028,362 A    2/2000  Omura
6,187,603 B1   2/2001  Haven et al.

FOREIGN PATENT DOCUMENTS

JP            5-4770 A  *  2/1993  ........... H01L/21/28

* cited by examiner

*Primary Examiner*—Tom Thomas
*Assistant Examiner*—Matthew E. Warren
(74) *Attorney, Agent, or Firm*—TraskBritt

(57) ABSTRACT

This invention is a process for manufacturing a random access memory array. Each memory cell within the array which results from the process incorporates a stacked capacitor, a silicon nitride coated access transistor gate electrode, and a self-aligned high-aspect-ratio digit line contact having a tungsten plug which extends from the substrate to a metal interconnect structure located at a level above the stacked capacitor. The contact opening is lined with titanium metal which is in contact with the substrate, and with titanium nitride that is in contact with the plug. Both the titanium metal and the titanium nitride are deposited via chemical vapor deposition reactions.

52 Claims, 7 Drawing Sheets

INTEGRATED CIRCUIT HAVING SELF-ALIGNED CVD-TUNGSTEN/TITANIUM CONTACT PLUGS STRAPPED WITH METAL INTERCONNECT AND METHOD OF MANUFACTURE

CROSS REFERENCE TO RELATED APPLICATION

This application is a divisional of application Ser. No. 09/447,981, filed Nov. 23, 1999, now U.S. Pat. No. 6,686,288, which is a continuation of application Ser. No. 08/994,950, filed Dec. 19, 1997, now U.S. Pat. No. 5,990,021, issued Nov. 23, 1999, which is a divisional of application Ser. No. 08/604,344, filed Feb. 21, 1996, abandoned.

BACKGROUND OF THE INVENTION

1. Field of the Invention

This invention relates to integrated circuits and, more particularly, to processes for fabricating high aspect ratio contact plugs, which are particularly useful in dynamic random access memories having stacked capacitors.

2. State of the Art

The business of producing dynamic random access memory (DRAM) devices is a very competitive, high-volume business. Process efficiency and manufacturability, as well as product quality, reliability, and performance are the key factors that determine the economic success of such a venture.

Each cell within a DRAM device, an individually-addressable location for storing a single bit of digital data, is comprised of two main components: a field-effect access transistor and a capacitor. Each new generation of DRAM devices generally has an integration level that is four times that of the generation which it replaced. Such a quadrupling of the number of devices per chip is always accompanied by a decrease in device geometries, and often by a decrease in operating voltages. As device geometries and operating voltages are decreased, the DRAM designer is faced with the difficult task of providing reliable, low-resistance electrical interconnections on the chip, increasing device operating speeds, and maintaining cell capacitance at an acceptable level. This must be accomplished without resorting to processes that reduce product yield or that markedly increase the number of masking and deposition steps in the production process.

During integrated circuit manufacture, it is common for contact openings to be etched through an insulative layer down to a diffusion region to which electrical contact is to be made. In a conventional contact formation process, titanium metal is sputtered over the wafer so that the exposed surface of the diffusion region is coated. The titanium metal is eventually converted to titanium silicide, thus providing an excellent conductive interface at the surface of the diffusion region. A titanium nitride barrier layer is then deposited, coating the walls and floor of the contact opening. Chemical vapor deposition of tungsten or polycrystalline silicon ("polysilicon") follows. In the case of tungsten, the titanium nitride layer provides greatly improved adhesion between the walls of the opening and the tungsten metal, in addition to preventing attack of the substrate and the formation of "wormholes" by tungsten hexafluoride, the precursor compound typically used for tungsten deposition. In the case of the polysilicon, the titanium nitride layer acts as a barrier against dopant diffusion from the polysilicon layer into the diffusion region.

Several factors have been responsible for an increase in contact aspect ratios. Given the need to maintain cell capacitance as the cell area dedicated to each cell on a wafer is shrunk, it has been necessary to employ three-dimensional capacitors for DRAMs of the 4-megabit generation and beyond. Although trench capacitors fabricated in the substrate have been utilized by several manufacturers, most have chosen to employ stacked capacitors (i.e., stacked above the substrate). Because stacked capacitors normally employ vertically-oriented capacitive layers, the stack height (i.e., the vertical distance from the substrate to the top of an insulating layer overlying the capacitive layers) has been increasing significantly with each new generation of stacked capacitor DRAMs. The increasing stack height coupled with the decreased area on the substrate to which electrical contact must be made has mandated an increase in contact aspect ratios (contact aspect ratio being the ratio of contact depth to contact opening width).

As decreasing device geometries shrink, the substrate area available for making contact to transistor source/drain regions (i.e., the contact landing pad), circuit designers are utilizing self-aligned contacts with increasing frequency. A self-aligned contact is one in which the contact plug is immediately adjacent a transistor gate spacer. With a self-aligned contact structure, the pitch between transistor gates can be narrowed, as the entire landing pad is utilized for making contact to the substrate. Thus, for a given pitch, contact resistance is minimized and reliability is enhanced. A self-aligned contact requires that the gate electrode be coated with a dielectric material that is largely unaffected by the anisotropic plasma contact etch through the interlevel dielectric layer.

The use of self-aligned contacts encourages the use of minimum-photolithographic-pitch layouts. A minimum-pitch layout coupled with the high-aspect ratio contacts that result in DRAM devices having stacked capacitors is not a good candidate for conventional contact formation, as contact between the small substrate landing pad and the contact conductive material must be particularly sound. For the 256-megabit generation of DRAMs, contacts having contact aspect ratios of greater than 5:1 will likely be the norm. With contact openings having such high aspect ratios, sputtering is ineffective at coating the bottom of the contact opening with titanium metal, as it tends to deposit primarily near the mouth of the opening such that the size of the opening becomes narrowed. The narrowing effect reduces the amount of titanium that can be deposited at the bottom of the opening. Since the bottom of the opening is also restricted in size by the use of a self-aligned contact, electrical contact to the substrate is typically poor. Although it is possible to collimate sputtered metal, thereby decreasing the buildup of sputtered material near the mouth of the contact opening and thereby increasing the amount of material that can be deposited at the bottom of the contact opening, deposition rates drop dramatically and deposition times correspondingly increase as collimator aspect ratios increase. At collimator height-to-width aspect ratios of only 2.5:1, deposition rates on the wafer are nearly zero, with most metal atoms being deposited on the collimator. Thus, the collimators must be cleaned with a frequency that is annoying, if not unacceptable, in a production environment. To date, the solutions proposed for this problem have required manufacturing process flows of increased complexity, which invariably tend to decrease product yield and increase product costs. For example, silicided polysilicon buried digit lines (a buried digit line is located at a level below that of the stacked capacitors) have been almost universally adopted by DRAM manufacturers as a solution to high-aspect ratio digit line contacts. The downside of using a silicided polysilicon buried digit line is that the increased resistance, as compared with that associated with a metal digit line, results in longer information access times. In addition, a buried digit line process typically requires two additional masking steps. Another solution to the problem is to use a polysilicon plug which makes contact to the substrate landing pad and a superjacent metal plug which makes contact to the polysilicon plug. The metal plugs are then strapped with a low-resistance metal interconnect. The downside of such a process flow is added complexity and increased product coat.

What is needed is a simplified DRAM process flow which takes advantage of a self-aligned contact for reduced pitch and greater chip density, and which is compatible with high-aspect-ratio contacts. Such a process and resulting structure will enhance device speed by permitting the use of a metal interconnect structure on top of the cell capacitors.

SUMMARY OF THE INVENTION

This invention is a process for manufacturing a dynamic random access memory array. Each memory cell within the array which results from the process incorporates a stacked capacitor, a silicon nitride coated access transistor gate electrode, and a self-aligned high-aspect-ratio digit line contact having a tungsten plug which extends from the substrate to a metal interconnect structure located at a level above the stacked capacitor. The contact opening is lined with titanium metal, which is in contact with the substrate, and with titanium nitride, which is in contact with the plug. Both the titanium metal and the titanium nitride are deposited via chemical vapor deposition reactions.

The DRAM process begins after field oxide and gate oxide formation with the patterning of word lines (i.e., the access transistor gates and gate interconnect lines) from a sandwich consisting of a lower layer of doped polysilicon, a middle layer of a refractory metal silicide (e.g., titanium silicide, tungsten silicide, cobalt silicide), and an upper layer of silicon nitride. Following word line formation, spacers are formed on the vertical edges of the word lines by anisotropically etching a subsequently deposited conformal silicon nitride layer. Following the formation of transistor source/drain regions (preferably through several implantation steps), a stacked capacitor is constructed above each source/drain which functions as a storage-node junction. During, following, or during and following the construction of the stacked capacitors, an interlevel silicon dioxide based dielectric layer such as boro-phospho-silicate glass ("BPSG") is deposited and preferably employed to planarize the array above the level of the stacked capacitors. Contact openings which are self aligned to the silicon nitride transistor spacers are then etched through the BPSG layer to each of the transistor source/drain regions in the substrate which will function as an access-node junction. Each of the contact openings is lined, first with titanium metal, and later with titanium nitride. Both the titanium metal and the titanium nitride layers are deposited via chemical vapor deposition, which provides greatly improved step coverage over sputter deposition methods. During a subsequent anneal step, the titanium metal which is in contact with each of the junctions at the bottom of the contact openings is converted to titanium silicide. The contact openings are then filled with tungsten metal via a further chemical vapor deposition reaction. The tungsten which deposited on top of the interlevel dielectric layer is removed via either a chemical mechanical polishing step or an etch-back step. Metal digit line interconnects which contact the appropriate tungsten plugs are then patterned from a sputtered aluminum alloy layer.

DETAILED DESCRIPTION OF THE INVENTION

Figure 1:
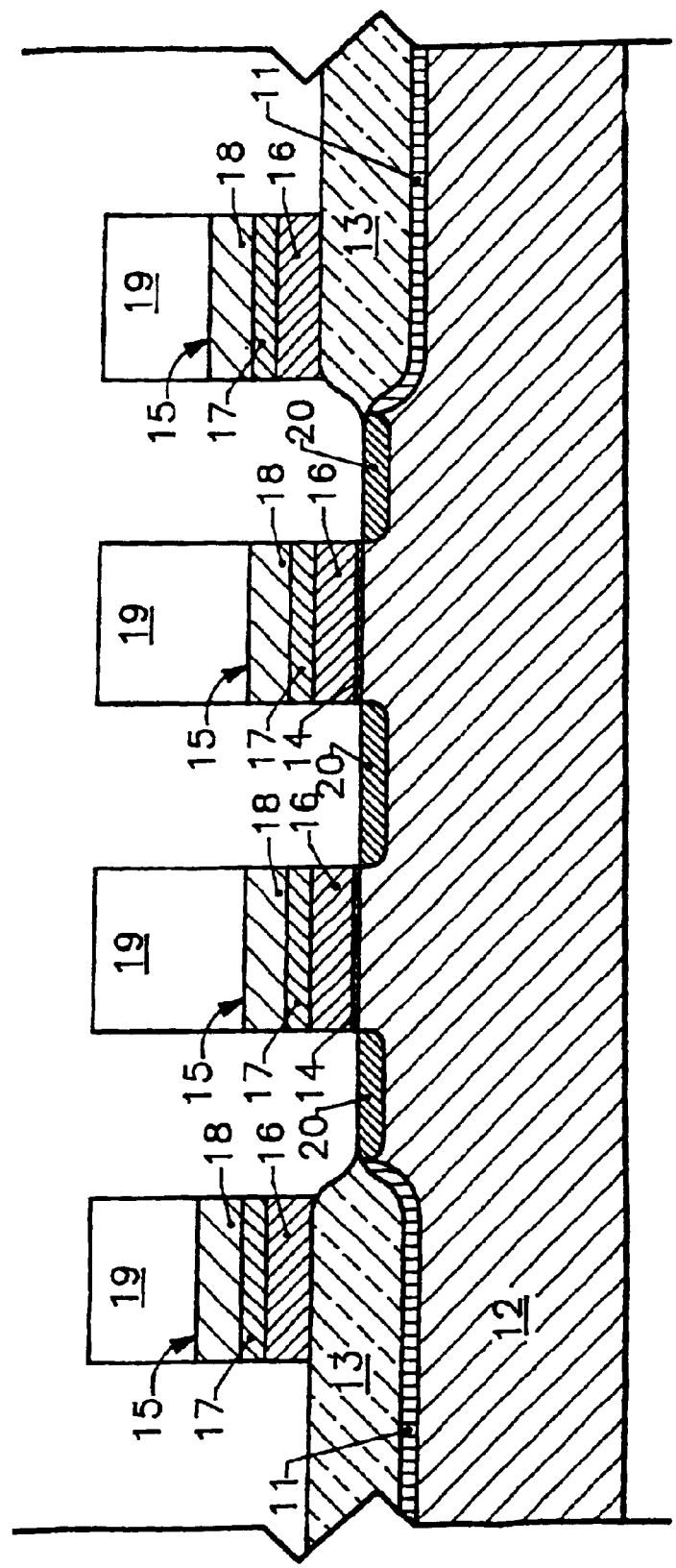
FIG. 1 is a cross-sectional view of a portion of an in-process DRAM array following field oxide and gate oxide formation and the patterning of word lines.

Referring now to FIG. 1, a cross-sectional view of a portion of the memory cell array of an in-process dynamic random access memory is shown. At this stage of processing, channel-stop regions 11 have been implanted in the substrate 12, field oxide regions 13 have been formed (with present technology, a modified local oxidation of silicon, or LOCOS, process is deemed to be the preferred method), a silicon dioxide gate dielectric layer 14 has been grown on the substrate, and word lines 15 have been formed (patterned) by masking and anisotropically etching a sandwich consisting of a doped polysilicon lower layer 16, a refractory metal silicide intermediate layer 17 (e.g., titanium silicide, tungsten silicide, cobalt silicide) which is employed to reduce word line resistance, and a silicon nitride upper layer 18. Anisotropic plasma etches are typically used for the etch which forms the word lines, as they provide structures with sidewalls which are substantially vertical (i.e., vertical or within several degrees of being vertical). When the term "vertical" is used in this disclosure, exact verticality is not to be implied, as perfect geometric relationships exist only in theory. The photoresist mask 19 used to pattern the word lines has not yet been stripped from the in-process circuitry. The term "word line" is used to denote the sets of serially connected field-effect transistor gates and gate interconnects in a memory array circuit. It should be understood that whenever a word line 15 traverses an active area (active areas are the regions of the substrate which are not covered by field oxide 13), it functions as the gate of a cell access transistor. Conversely, when a word line traverses a field oxide region 13, it functions as an interconnect line which couples the gates of a single row of cells within the array to a word line driver device (not shown). Anti-punch through or lightly-doped source/drain regions 20 have also been implanted into those portions of the active areas which are exposed following the word line etch.

Figure 2:
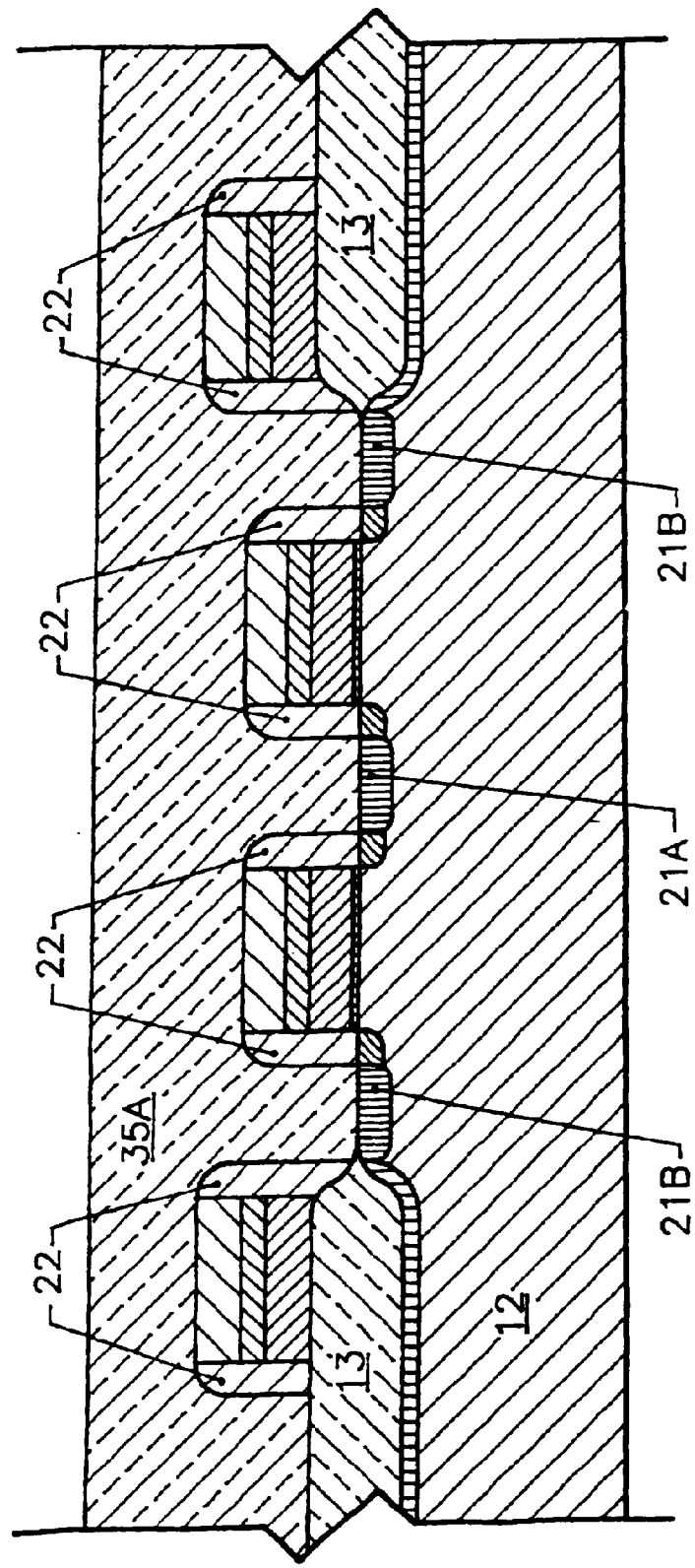
FIG. 2 is a cross-sectional view of the in-process DRAM array portion of FIG. 1 following the formation of access transistor source/drain regions and the formation of spacers on the word line sidewalls.

Referring now to FIG. 2, the array portion of FIG. 1 has received further processing to create source/drain regions for the cell access transistors. The centrally positioned source/drain region 21A, which is shared by both adjacent transistor gates, will function as the access-node junction, to which digit line contact will be made. The laterally located source/drain regions 21B, each of which will function as a storage-node junction, are adjacent a single transistor gate and, thus, are employed by only one memory cell. Silicon nitride spacers 22 are formed on the word line sidewalls by anisotropically etching an unmasked, conformally-deposited silicon nitride layer (not shown). The silicon nitride upper layer 18 on the upper surface of the word line conductive portions, in combination with the nitride spacers 22 on the sidewalls of the word lines, is referred to herein as the word line isolation layer. Although the formation of source/drain regions for ULSI circuitry is a complicated process, as junctions having graded dopant densities are generally required to eliminate short channel effects, this disclosure will not deal with those complexities, as they are irrelevant to the focus of the present invention. Following transistor processing, a first interlevel dielectric layer 35A is deposited.

Figure 3:
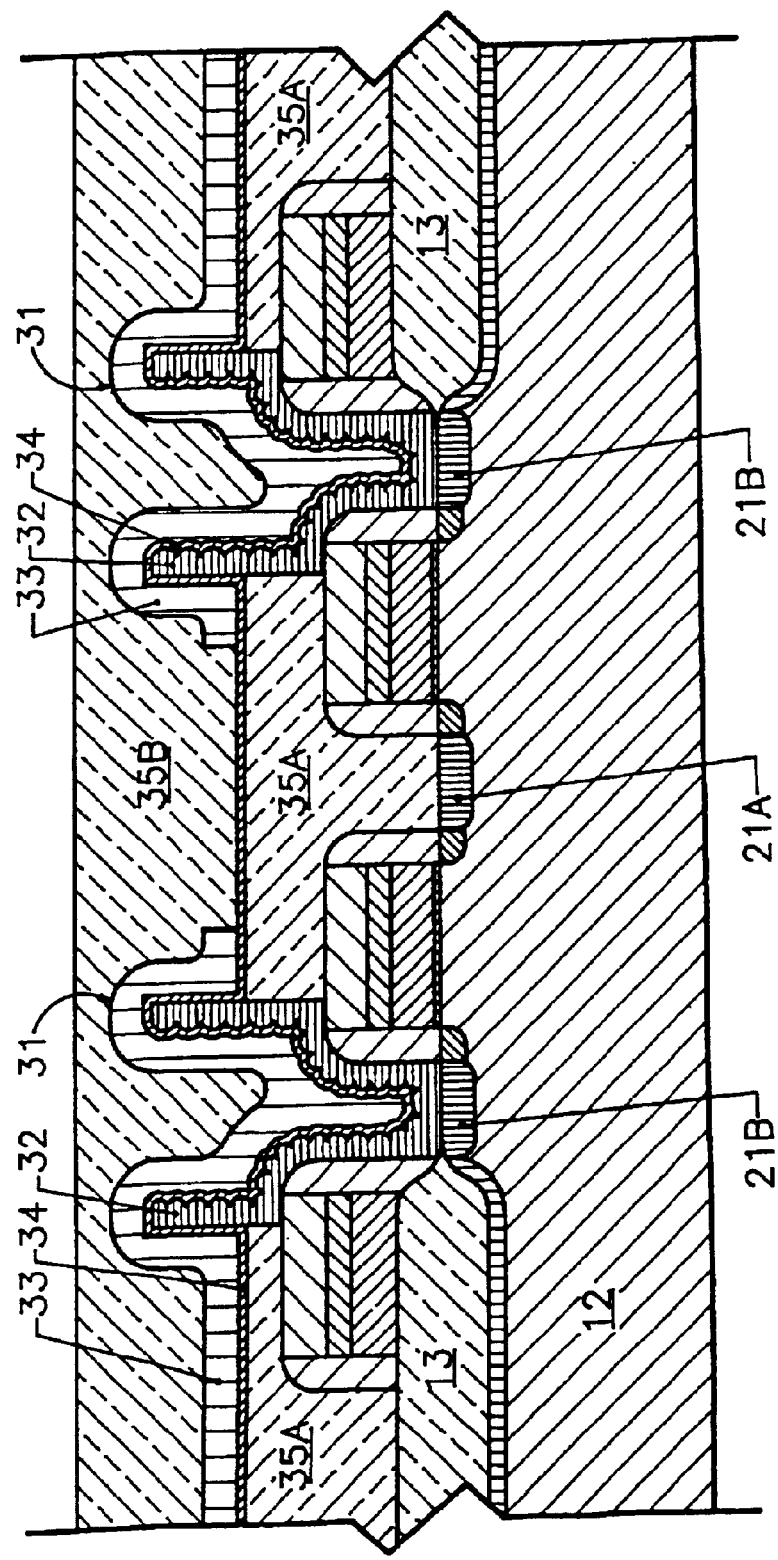
FIG. 3 is a cross-sectional view of the in-process DRAM array portion of FIG. 2 following the formation of typical stacked capacitors and the deposition and planarization of an interlevel dielectric layer.

Referring now to FIG. 3, the array portion of FIG. 2 is subjected to further processing to form stacked capacitors 31. Each capacitor 31, which is superjacent a storage-node junction 21B, comprises a lower capacitive layer (the storage-node plate) 32 which is in electrical contact with the storage-node junction 21B, an upper capacitive layer (the cell plate) 33, and a capacitor dielectric layer 34 sandwiched between the two capacitive layers. It will be noted that a portion of the upper capacitive layer 33 has been etched away above the access-node junction 21A in order to eliminate complications of having to later put a contact plug through an unrelated conductive layer and from which it must be insulated. The capacitor dielectric layer 34, on the other hand, is optionally left unetched over the access-node junction 21A. During the fabrication of capacitors 31, the first interlevel dielectric layer 35A (preferably BPSG) is employed as a mold layer in which is formed the storage-node plates 32. Following the completion of capacitor fabrication, a second interlevel dielectric layer 35B (also, preferably BPSG) is deposited over the entire array and planarized (preferably via a chemical mechanical polishing step) to a level above the stacked capacitors. It should be noted that once the second interlevel dielectric layer 35B is annealed, it fuses with the first interlevel dielectric layer 35A, becoming indistinguishable therefrom. In the appended claims, the two layers are referred to as a single interlevel dielectric layer.

Figure 4:
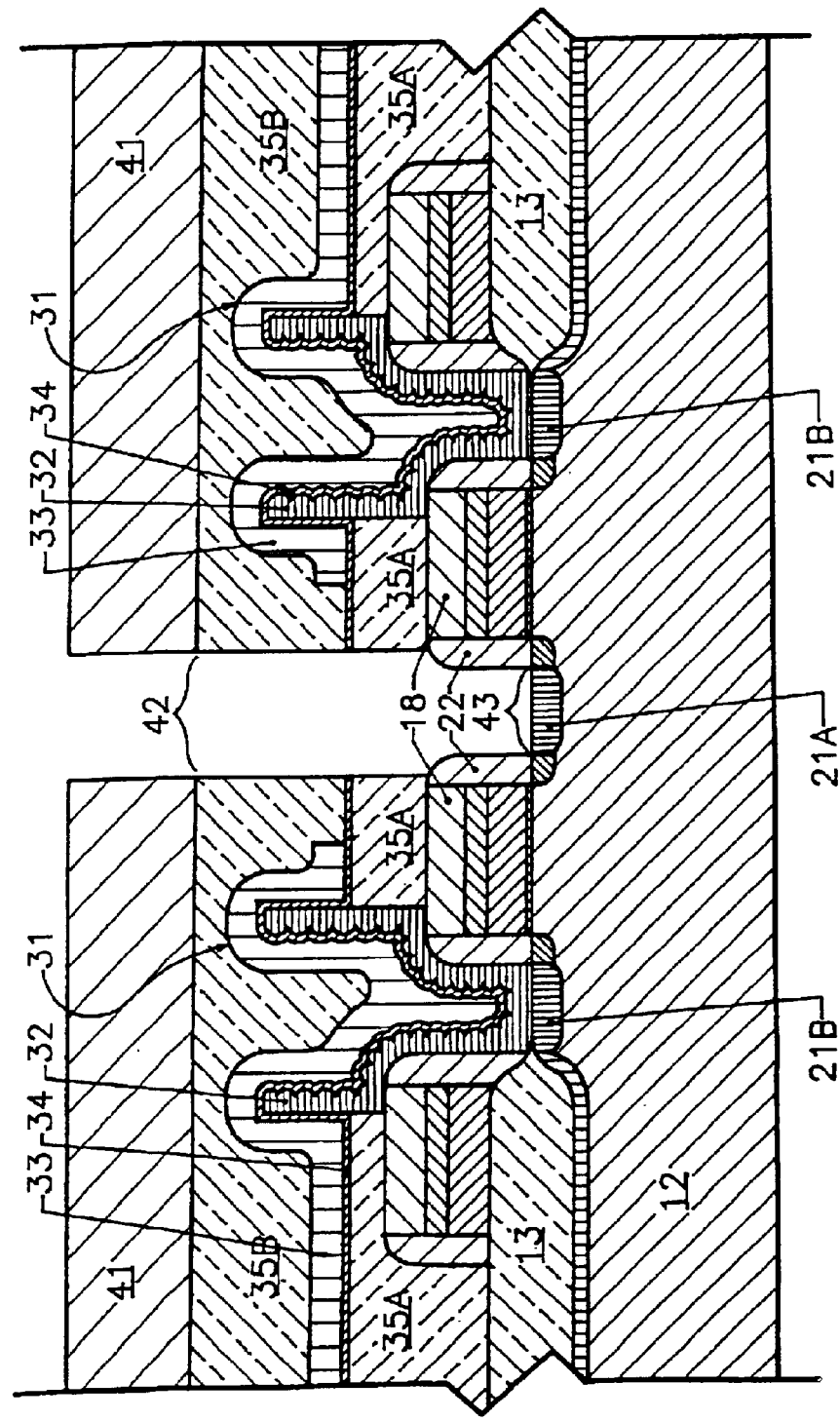
FIG. 4 is a cross-sectional view of the in-process DRAM array portion of FIG. 3 following the masking of the interlevel dielectric layer with a digit line contact mask and etching of the contact openings through the interlevel dielectric layer to the underlying junctions in the substrate.

Referring now to FIG. 4, the in-process DRAM array portion of FIG. 3 is masked with a digit line contact mask 41 and anisotropically etched to form contact openings 42 (only one shown) through the interlevel dielectric layer 35 (comprised of layers 35A and 35B) to the underlying access-node junctions 21A in the substrate. It will be noted that the lower portion of the contact opening is self-aligned to the spacers 22 on either side of the access-node junction 21A. This result will naturally follow if the word lines are formed at or near minimum photolithographic pitch. At minimum photolithographic pitch, space and feature widths are at the resolution limit of the stepper (the machine employed to expose the photoresist). Since the spacers on the sidewalls of the word lines have narrowed the minimum-pitch space between the word lines, and because the minimum space for the digit line contact mask 41 is the same as for the mask used to etch the word lines (assuming that the same type of photolithographic equipment is employed for mask exposure), the contact opening, as defined by the digit line contact mask 41 will be wider than the landing pad 43 of the access-node junction 21A, which has been narrowed by the spacers 22. In order to prevent shorting of the digit line (not yet formed) to the word lines, an anisotropic plasma etch that etches the interlevel dielectric layer 35 selectively with respect to the spacers 22 and the silicon nitride layer 18 atop the word lines is required. Anisotropic plasma etches that etch BPSG selectively (i.e., the etch rate of BPSG is so much greater than that of silicon nitride that the etching of silicon nitride is insignificant) with respect to silicon nitride are well known in the art. It should be noted that during the etch of the contact opening, it may be necessary to etch through the capacitor dielectric layer 34 if it was optionally left unetched over the access node junction 21A. If the capacitor dielectric layer comprises silicon nitride, the selectivity is decreased during an early portion of the etch so that the silicon nitride layer may be easily penetrated.

Figure 5:
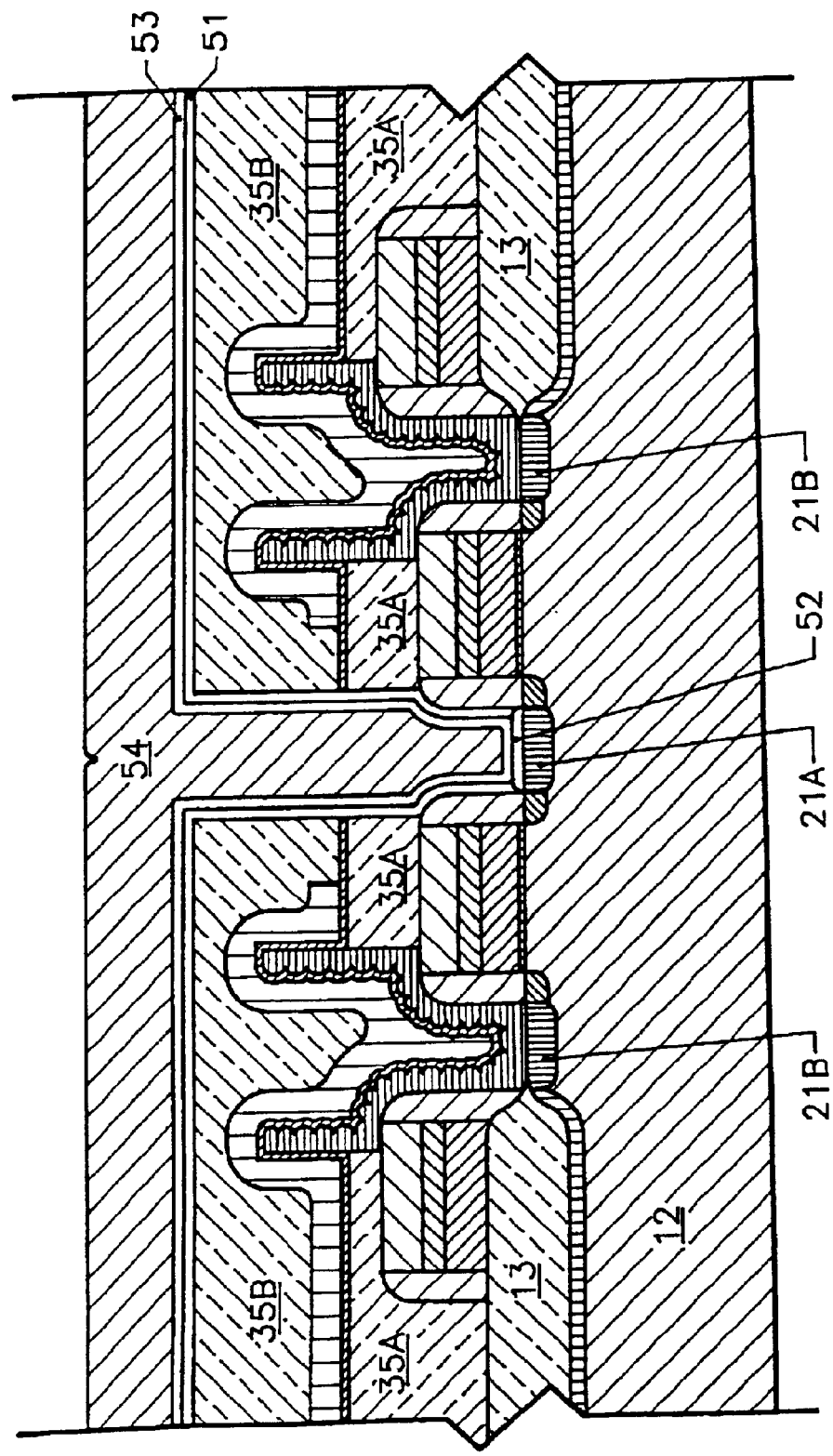
FIG. 5 is a cross-sectional view of the in-process DRAM array portion of FIG. 4 following the sequential deposition of a titanium metal layer, a titanium nitride layer, and a tungsten layer.

Referring now to FIG. 5, following an in situ clean step (preferably using a plasma etch) to remove the native oxide from the surface of the substrate at the bottom of the contact opening, a titanium metal layer 51 is deposited on all exposed surfaces of the in-process DRAM array portion of FIG. 4 via chemical vapor deposition (CVD). The preferred precursor gases for the CVD reaction are $TiCl_4$, with a flow rate of about 30 sccm, and $H_2$, with a flow rate of about 100 sccm. Argon, an inert gas, is also introduced into the reaction chamber. The chamber is equipped with a shower head that is RF-powered (e.g., 400 kHZ to 13.56 MHz) to create a plasma. The temperature range for the wafer is 450–550° C. The chamber pressure is 5–10 torr. Thus the titanium metal layer 51 lines the interior of the contact opening 42 and covers the landing pad (the portion of the junction exposed by the contact etch) of access-node junction 21A. As the contact opening has a high aspect ratio (in this case, it is greater than 5:1), the deposition of titanium metal via a chemical vapor (CVD) reaction provides the step coverage required to adequately cover the junction at the bottom of the contact opening 42. At this stage of the process, an elevated-temperature anneal step may be performed to convert at least a portion of the titanium metal layer 51 that overlies the access-node junction 21A to a titanium silicide layer 52. Following the anneal step, a titanium nitride layer 53 is deposited on all exposed surfaces of the array via chemical vapor deposition. A preferred CVD reaction for titanium nitride is discussed in U.S. Pat. No. 5,192,589, and employs tetrakis(dimethylamido)titanium and ammonia as precursors. The excellent step coverage afforded by this chemical vapor deposition reaction results in relatively conformal deposition of the titanium nitride layer 53 within the entire contact opening 42. A variation in the process would be to perform the aforementioned anneal step following the deposition of the titanium nitride layer 53. Finally, a tungsten layer 54 is also deposited via chemical vapor deposition. CVD deposition of tungsten is already well known in the art and no further discussion is deemed necessary. The tungsten layer 54 is deposited to a thickness sufficient to completely fill the contact opening 42.

Figure 6:
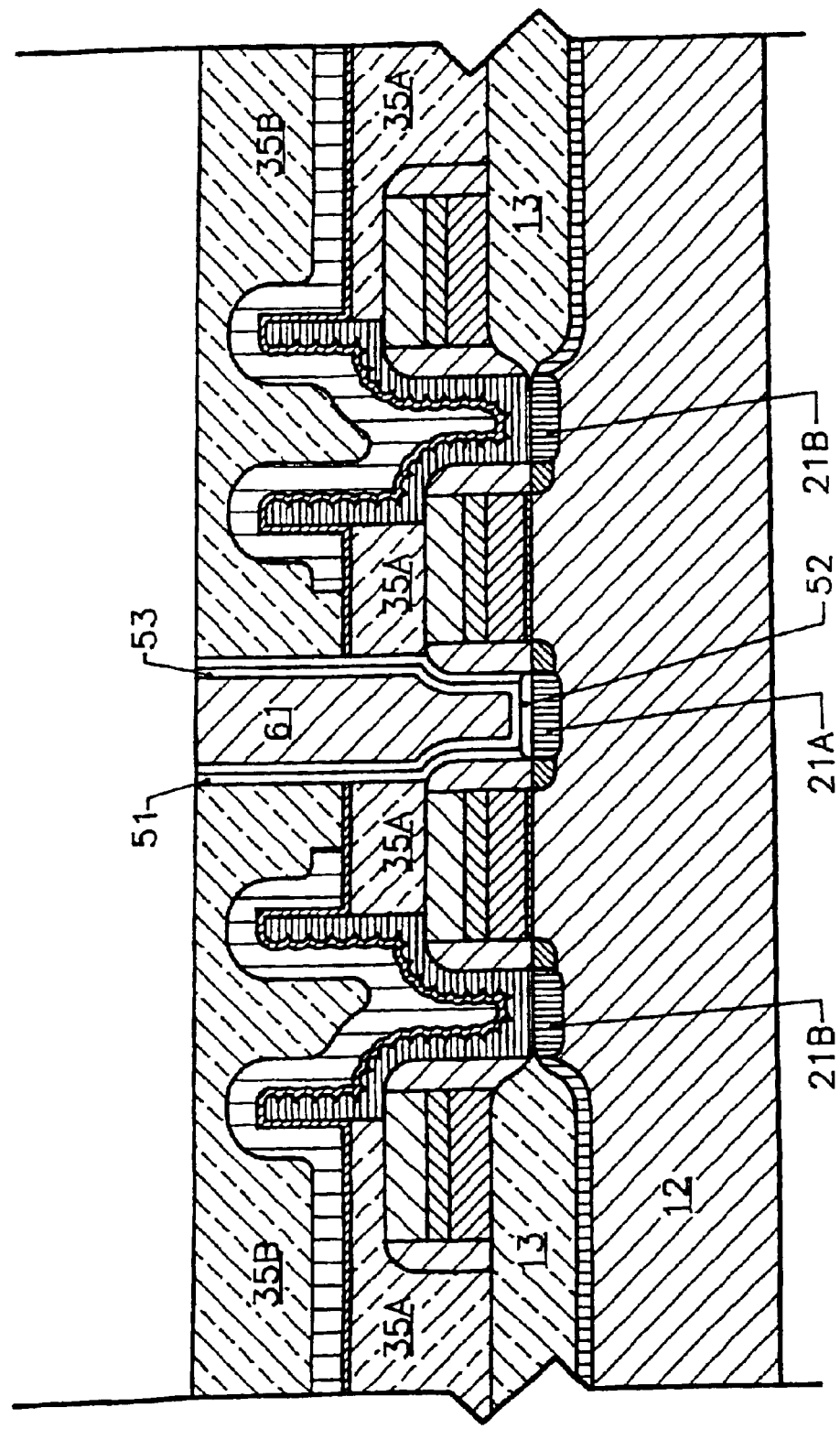
FIG. 6 is a cross-sectional view of the in-process DRAM array portion of FIG. 5 following a chemical mechanical polishing step which removes the tungsten, the titanium nitride, and the titanium metal from the upper surface of the interlevel dielectric layer.

Referring now to FIG. 6, the array portion of FIG. 5 is subjected to a chemical mechanical polishing step which removes portions of the tungsten layer 54, portions of the titanium nitride layer 53, and portions of the titanium metal layer 51 which lie on the upper surface of the interlevel dielectric layer 35, leaving those portions of the tungsten layer 54, the titanium nitride layer 53 and the titanium metal layer 51 which are within the confines of the contact opening 42. A tungsten plug 61 remains in each digit line contact opening.

Figure 7:
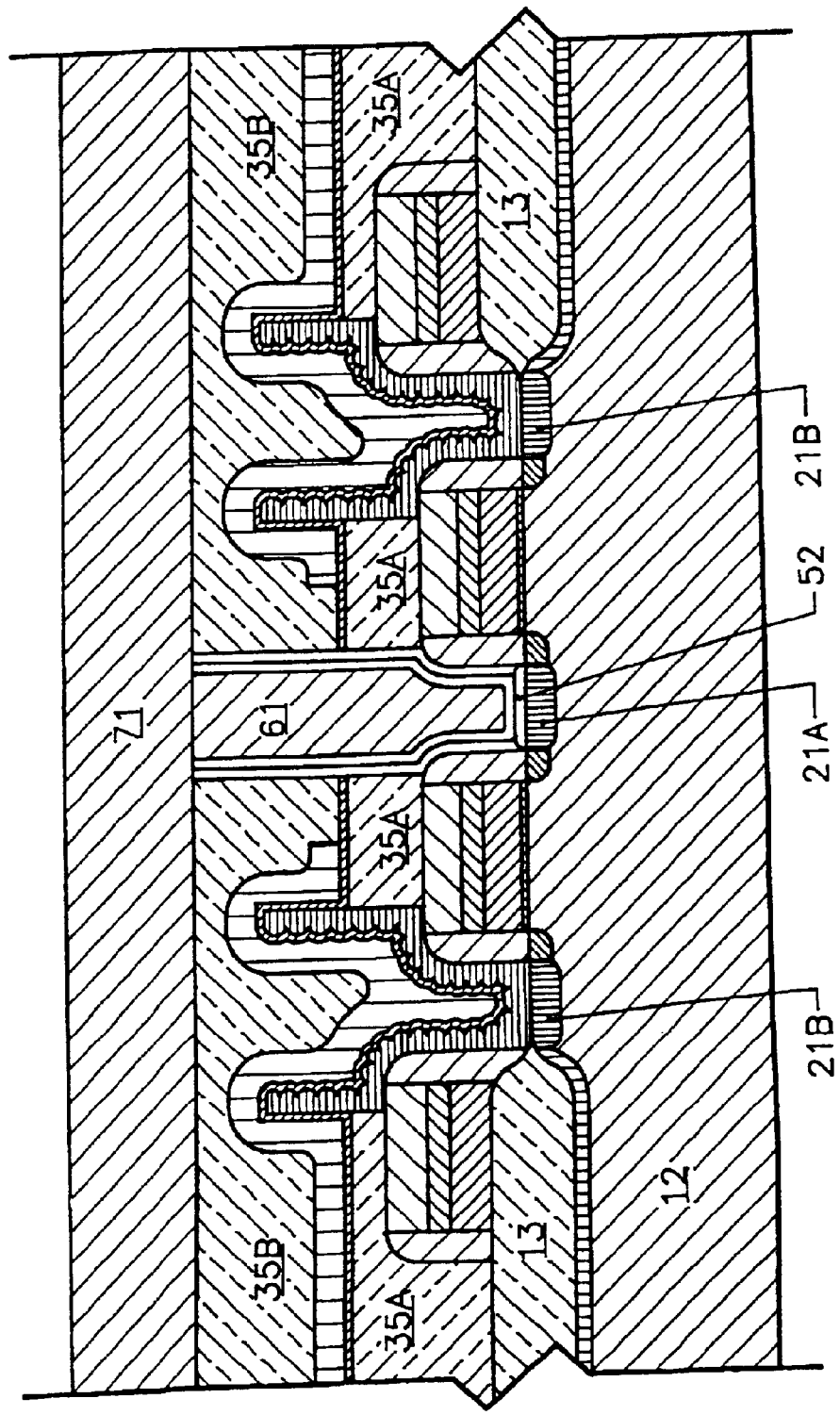
FIG. 7 is a cross-sectional view of the in-process DRAM array portion of FIG. 6 following the deposition of a low-resistance metal layer and patterning of that metal layer to form a digit line interconnect structure.

Referring now to FIG. 7, an aluminum alloy layer is deposited on the array portion of FIG. 6, masked with a digit line interconnect mask (not shown) and etched to form a plurality of digit lines 71 (only one digit line is depicted in the figure) on the upper surface of the interlevel dielectric layer 35. Each digit line makes electrical contact to the tungsten plugs 61 which pertain to a single column of memory cells within the array.

Although only a single embodiment of the invention (and minor variations thereof) is disclosed herein, it will be obvious to those having ordinary skill in the art of integrated circuit manufacture that changes and modifications may be made thereto without departing from the scope and the spirit of the invention as hereinafter claimed. For example, the process, though disclosed in connection with a dynamic random access memory having stacked capacitors, is applicable to any integrated circuit requiring high-aspect ratio contacts.

What is claimed is:

1. A dynamic random access memory array located on a silicon substrate, said array comprising:
   a plurality of memory cells, each memory cell including a field-effect access transistor and a stacked capacitor, each field-effect transistor having a first source/drain region functioning as a storage-node junction, each first source/drain region directly connected to the capacitor of each memory cell, each field-effect transistor having a second source/drain region functioning as an access-node junction, having an insulated gate having a lower surface overlying the substrate and insulated therefrom by a gate dielectric layer, having an upper surface, and having vertical sidewalls, said upper surface and said sidewalls being covered by a first dielectric material layer;
   an interlevel dielectric layer comprising a second dielectric material, said interlevel dielectric layer blanketing the array to a level above that of the capacitors;
   a plurality of digit line contact openings, each contact opening penetrating the interlevel dielectric layer and terminating at an access-node junction, each of said contact openings being self-aligned to the first dielectric material layer, each access-node junction being at least partially covered by a titanium silicide layer, the titanium silicide layer being laterally bordered by the first dielectric material layer, each contact opening being lined with a layer of titanium metal and a layer of CVD titanium nitride located thereover and filled with a CVD tungsten plug;
   a plurality of digit lines formed on top of the interlevel dielectric layer, each digit line making electrical contact to each tungsten plug of a plurality of tungsten plugs; and
   an aspect ratio of at least about 2.5:1.

2. The dynamic random access memory array of claim 1, wherein at least a portion of the titanium metal which overlies each access-node junction has reacted with silicon atoms on a surface of each access-node junction to form the titanium silicide layer.

3. The dynamic random access memory array of claim 1, wherein the aspect ratio is at least about 5:1.

4. A dynamic random access memory cell array located on a silicon substrate, said array comprising:
   a plurality of word lines, at least one of said plurality of word lines having a lower surface dielectrically insulated from the substrate by at least one silicon dioxide layer, said plurality of word lines each having an upper surface and sidewalls covered by a layer of silicon nitride;
   a capacitor for each memory cell of said dynamic random access memory cell array, each capacitor for storing a charge, the charge stored within each capacitor being accessible by at least one word line of said plurality of word lines;
   an interlevel dielectric layer covering the memory cell array and the capacitors thereof;
   a plurality of contact openings, each contact opening of the plurality of contact openings penetrating the interlevel dielectric layer to a junction in the substrate, each junction being covered by a titanium silicide layer and located adjacent at least one word line of the plurality of word lines, the titanium silicide layer laterally bordered by the silicon nitride layer on the sidewall, each contact opening of said plurality of contact openings at least partially overlapping the silicon nitride layer on the sidewall of said at least one adjacent word line, each of said contact openings lined with a CVD titanium nitride layer and at least partially filled with a CVD tungsten plug;
   a plurality of digit lines formed on the interlevel dielectric layer, each digit line making electrical contact to each tungsten plug of a plurality of tungsten plugs; and
   an aspect ratio of at least about 2.5:1.

5. The memory cell array of claim 4, wherein each capacitor comprises a stacked configuration.

6. The memory cell array of claim 4, wherein each contact opening of said plurality of contact openings, except in an area of the junction, further includes a lining of a titanium metal layer which is in contact with the titanium nitride layer, but not in contact with the tungsten plug that is within each contact opening.

7. The memory cell array of claim 4, wherein each contact opening of said plurality of contact openings includes a lining of a titanium metal layer in contact with the titanium nitride layer, but not in contact with the tungsten plug within each contact opening, said titanium metal layer overlying the titanium silicide layer in an area of the junction.

8. The memory cell array of claim 4, wherein each word line of said plurality is insulated from the substrate along a portion of its length by a gate oxide layer and along a remainder of its length by a field oxide layer.

9. The memory cell array of claim 4, wherein each word line of said plurality comprises a doped polycrystalline silicon lower portion and a refractory metal silicide portion thereover.

10. The memory cell array of claim 4, wherein each word line of said plurality functions as a gate of a field effect cell access transistor for portions of its length where it traverses a gate oxide layer, each access transistor coupling a cell capacitor to a digit line of the plurality.

11. The dynamic random access memory array of claim 4, wherein the aspect ratio is at least about 5:1.

12. A dynamic random access memory on a silicon substrate, said memory comprising:

an array of memory cells, each memory cell of said array including a field-effect access transistor and a stacked capacitor, each transistor having a first source/drain region forming a storage-node junction, each first source/drain region being coupled to the capacitor of each memory cell, each transistor having a second source/drain region forming an access-node junction, each transistor having an insulated gate having a lower surface overlying the substrate and insulated therefrom by a gate dielectric layer, having an upper surface, and having generally vertical sidewalls, said upper surface and said sidewalls being covered by a first dielectric material;

an interlevel dielectric layer comprising a second dielectric material, said interlevel dielectric layer blanketing the array of memory cells to a level above that of the capacitors;

a plurality of digit line contact openings, each contact opening extending through the interlevel dielectric layer and terminating at an access-node junction, each access-node junction being at least partially covered by a titanium silicide layer, the titanium silicide layer being laterally bordered by the first dielectric material, each digit line contact opening of said plurality of digit line contact openings self-aligned to the first dielectric material, each contact opening lined with a titanium metal layer, lined with a CVD titanium nitride layer, and filled with a CVD tungsten plug;

a plurality of digit lines formed on top of the interlevel dielectric layer, each digit line making electrical contact to each tungsten plug of a plurality of tungsten plugs; and an aspect ratio of at least 2.5:1.

13. The dynamic random access memory of claim 12, wherein said second dielectric material is selectively etchable with respect to said first dielectric material.

14. The dynamic random access memory of claim 13, wherein at least a portion of the titanium metal which overlies each access-node junction has reacted with silicon atoms on the surface of each access-node junction to form the titanium silicide layer.

15. The dynamic random access memory of claim 12, wherein the aspect ratio is at least about 5:1.

16. A dynamic random access memory fabricated on a silicon substrate, the memory comprising:

an array of memory cells, each memory cell of the array of memory cells including a stacked capacitor and a field-effect access transistor having a gate electrode overlying the substrate, the gate electrode being dielectrically insulated from the substrate by a gate dielectric layer, the gate electrode having an upper surface and sidewalls covered by a first dielectric material coating;

an interlevel dielectric layer formed from a second dielectric material selectively etchable with respect to the first dielectric material, the interlevel dielectric layer blanketing the memory cell array;

a plurality of contact openings, each contact opening of the plurality of contact openings penetrating the interlevel dielectric layer to a region of the substrate contacting a single access transistor, the region of the substrate covered by a titanium silicide layer, the titanium silicide layer being laterally bordered by the first dielectric material coating, each contact opening of the plurality of contact openings at least partially overlapping the first dielectric material coating, each contact opening of the plurality of contact openings lined with a CVD titanium nitride layer and at least partially filled with a CVD tungsten plug;

a plurality of digit lines formed on top of the interlevel dielectric layer, each digit line making electrical contact to each tungsten plug of a plurality of tungsten plugs; and an aspect ratio of at least about 2.5:1.

17. The dynamic random access memory of claim 16, wherein each contact opening of said plurality of contact openings, except in an area of the region of the substrate, is lined with a titanium metal layer contacting the titanium nitride layer, but not contacting the tungsten plug within each contact opening.

18. The dynamic random access memory of claim 16, wherein each contact opening of said plurality of contact openings is lined with a titanium metal layer contacting the titanium nitride layer, but not contacting the tungsten plug within each contact opening, said titanium metal layer overlying the titanium silicide layer in an area of the region of the substrate.

19. The dynamic random access memory of claim 16, wherein each gate electrode comprises a doped polycrystalline silicon lower portion and a refractory metal silicide portion above the lower portion.

20. The dynamic random access memory of claim 16, wherein the aspect ratio is at least about 5:1.

21. A dynamic random access memory on a silicon substrate, the memory comprising:

an array of stacked-capacitor memory cells, each memory cell of said array of memory cells having a field-effect access transistor with a channel formed in the substrate and a gate electrode overlying the substrate, the gate electrode having an upper surface and sidewalls covered by a first dielectric material coating;

an interlevel dielectric layer formed from a second dielectric material, the interlevel dielectric layer blanketing the memory cell array;

a plurality of contact openings, each contact opening penetrating the interlevel dielectric layer to a region of the substrate contacting a single access transistor, the region of the substrate covered by a titanium silicide layer, the titanium silicide layer being laterally bordered by the first dielectric material coating, each contact opening of the plurality of contact openings at least partially overlapping the first dielectric material coating on the sidewalls of each gate electrode, each of the contact openings being lined with a CVD titanium nitride layer and at least partially filled with a CVD tungsten plug;

a plurality of digit lines formed on top of the interlevel dielectric layer, each digit line making electrical contact to each tungsten plug of a plurality of tungsten plugs; and an aspect ratio of at least about 2.5:1.

22. The dynamic random access memory of claim 21, wherein the second dielectric material is selectively etchable with respect to the first dielectric material.

23. The dynamic random access memory of claim 21, wherein each contact opening of the plurality of contact openings, except in an area of the region of the substrate, is lined with a titanium metal layer contacting the titanium nitride layer, but not contacting the tungsten plug within each contact opening.

24. The dynamic random access memory of claim 21, wherein each contact opening of the plurality of contact openings is lined with a titanium metal layer contacting the titanium nitride layer, but not contacting the tungsten plug within each opening, the titanium metal layer overlying the titanium silicide layer in an area of the region of the substrate.

25. The dynamic random access memory of claim 21, wherein each gate electrode comprises a doped polycrystalline silicon lower portion and a refractory metal silicide portion above the lower portion.

26. The dynamic random access memory of claim 21, wherein the aspect ratio is at least about 5:1.

27. A memory array on a silicon substrate comprising:
a plurality of memory cells, each memory cell including a field-effect access transistor and a stacked capacitor, each field-effect access transistor having a first source/drain region as a storage-node junction, each first source/drain region directly connected to the stacked capacitor of each memory cell, each field-effect access transistor having a second source/drain region as an access-node junction, each field-effect access transistor having an insulated gate having a lower surface overlying the silicon substrate and insulated therefrom by a gate dielectric layer, having an upper surface, and having vertical sidewalls, the upper surface and said sidewalls covered by a first dielectric material layer;
an interlevel dielectric layer comprising a second dielectric material, the interlevel dielectric layer blanketing said memory array at a level above that of at least one capacitor;
a plurality of digit line contact openings, each contact opening penetrating the interlevel dielectric layer and terminating at an access-node junction, each access-node junction being at least partially covered by a titanium silicide layer, the titanium silicide layer being laterally bordered by the first dielectric material layer, each of said contact openings being self-aligned to the first dielectric material layer, each contact opening being lined with a layer of titanium metal and a layer of CVD titanium nitride thereabove and filled with a CVD tungsten plug;
a plurality of digit lines formed on top of the interlevel dielectric layer, each digit line making electrical contact to each tungsten plug of a plurality of tungsten plugs; and
an aspect ratio of at least about 2.5:1.

28. The memory array of claim 27, wherein at least a portion of the titanium metal which overlies each access-node junction has reacted with silicon atoms on a surface of each access-node junction to form the titanium silicide layer.

29. The memory array of claim 27, wherein the aspect ratio is at least about 5:1.

30. A memory cell array on a silicon substrate comprising:
a plurality of word lines, at least one of said plurality of word lines having a lower surface dielectrically insulated from the substrate by at least one silicon dioxide layer, the plurality of word lines each having an upper surface and sidewalls covered by a layer of silicon nitride;
a capacitor for each memory cell of said memory cell array, each capacitor for storing a charge, the charge stored within each capacitor being accessible by the at least one word line of the plurality of word lines;
an interlevel dielectric layer covering the memory cell array and the capacitors thereof;
a plurality of contact openings, each contact opening of the plurality of contact openings penetrating the interlevel dielectric layer to a junction in the substrate, each junction being covered by a titanium silicide layer and located adjacent the at least one word line of the plurality of word lines, the titanium silicide layer laterally bordered by the silicon nitride layer on the sidewall, each contact opening of said plurality of contact openings at least partially overlapping the silicon nitride layer on the sidewalls of the at least one adjacent word line, each of the contact openings lined with a CVD titanium nitride layer and at least partially filled with a CVD tungsten plug;
a plurality of digit lines formed on the interlevel dielectric layer, each digit line making electrical contact to each tungsten plug of a plurality of tungsten plugs; and
an aspect ratio of at least about 2.5:1.

31. The memory cell array of claim 30, wherein each capacitor comprises a stacked configuration.

32. The memory cell array of claim 30, wherein each contact opening of said plurality of contact openings, except in an area of the junction, further includes a lining of a titanium metal layer which is in contact with the titanium nitride layer, but not in contact with the tungsten plug that is within each contact opening.

33. The memory cell array of claim 30, wherein each contact opening of the plurality of contact openings includes a lining of a titanium metal layer in contact with the titanium nitride layer, but not in contact with the tungsten plug within each contact opening, the titanium metal layer overlying the titanium silicide layer in an area of the junction.

34. The memory cell array of claim 30, wherein each word line of the plurality of word lines is insulated from the substrate along a portion of its length by a gate oxide layer and along a remainder of its length by a field oxide layer.

35. The memory cell array of claim 30, wherein each word line of the plurality of word lines comprises a doped polycrystalline silicon lower portion and a refractory metal silicide portion thereover.

36. The memory cell array of claim 30, wherein each word line of the plurality of word lines functions as a gate of a field-effect cell access transistor for portions of its length where it traverses a gate oxide layer, each access transistor coupling a cell capacitor to a digit line of the plurality of digit lines.

37. The dynamic memory cell array of claim 30, wherein the aspect ratio is at least about 5:1.

38. A memory array on a silicon substrate comprising:
an array of memory cells, each memory cell of said array including a field-effect access transistor and a stacked capacitor, each transistor having a first source/drain region as a storage-node junction, each first source/drain region being coupled to the capacitor of a memory cell, each transistor having a second source/drain region as an access-node junction, each transistor having an insulated gate having a lower surface overlying the substrate and insulated therefrom by a gate dielectric layer, having an upper surface, and having generally vertical sidewalls, the upper surface and the sidewalls covered by a first dielectric material;
an interlevel dielectric layer comprising a second dielectric material, the interlevel dielectric layer blanketing the array to a level above that of the capacitors;
a plurality of digit line contact openings, each contact opening extending through the interlevel dielectric layer and terminating at an access-node junction, each access-node junction being at least partially covered by a titanium silicide layer, the titanium silicide layer being laterally bordered by the first dielectric material, each digit line contact opening of said plurality of digit line contact openings self-aligned to the first dielectric material, each contact opening lined with a titanium metal layer, lined with a CVD titanium nitride layer, and filled with a CVD tungsten plug;

a plurality of digit lines formed on top of the interlevel dielectric layer, each digit line making electrical contact to each tungsten plug of a plurality of tungsten plugs; and an aspect ratio of at least about 2.5:1.

39. The memory array of claim 38, wherein the second dielectric material is selectively etchable with respect to said first dielectric material.

40. The memory array of claim 39, wherein at least a portion of the titanium metal layer which overlies each access-node junction has reacted with silicon atoms on a surface of each access-node junction to form titanium silicide.

41. The memory array of claim 38, wherein the aspect ratio is at least about 5:1.

42. An access memory on a silicon substrate comprising:

an array of memory cells, each memory cell of said array of memory cells including a stacked capacitor and a field-effect access transistor having a gate electrode overlying the substrate, said gate electrode dielectrically insulated from the substrate by a gate dielectric layer, the gate electrode having an upper surface and sidewalls covered by a first dielectric material coating;

an interlevel dielectric layer including a second dielectric material selectively etchable with respect to the first dielectric material, the interlevel dielectric layer blanketing the memory cell array;

a plurality of contact openings, each contact opening of said plurality of contact openings penetrating the interlevel dielectric layer to a region of the substrate contacting a single access transistor, the region of said substrate covered by a titanium silicide layer the titanium silicide layer, being laterally bordered by the first dielectric material coating, and each contact opening of the plurality of contact openings at least partially overlapping the first dielectric material coating, each opening of the plurality of contact openings lined with a CVD titanium nitride layer and at least partially filled with a CVD tungsten plug;

a plurality of digit lines formed on top of the interlevel dielectric layer, each digit line making electrical contact to each tungsten plug of a plurality of tungsten plugs; and an aspect ratio of at least about 2.5:1.

43. The access memory of claim 42, wherein each contact opening of said plurality of contact openings, except in the area of the junction, lined with a titanium metal layer contacting with the titanium nitride layer, but not contacting the tungsten plug within the contact opening.

44. The access memory of claim 42, wherein each contact opening of said plurality of contact openings lined with a titanium metal layer contacting the titanium nitride layer, but not contacting the tungsten plug within the opening, said titanium metal layer overlying the titanium silicide layer in the area of the junction.

45. The access memory of claim 42, wherein each word line comprises a doped polycrystalline silicon lower portion and a refractory metal silicide portion above the lower portion.

46. The access memory of claim 42, wherein the aspect ratio is at least about 5:1.

47. An access memory on a silicon substrate comprising:

an array of stacked-capacitor memory cells, each memory cell of said array of memory cells having a field-effect access transistor having a channel formed in the substrate and a gate electrode overlying the substrate, said gate electrode having an upper surface and sidewalls covered by a first dielectric material coating;

an interlevel dielectric layer including a second dielectric material, the interlevel dielectric layer blanketing the memory cell array;

a plurality of contact openings, each contact opening penetrating the interlevel dielectric layer to a region of the substrate contacting a single access transistor, said region covered by a titanium silicide layer, the titanium silicide layer being laterally bordered by the first dielectric material coating, each contact opening of said plurality of contact openings at least partially overlapping the first dielectric material coating on the sidewall of a gate electrode, each of the contact openings being lined with a CVD titanium nitride layer and at least partially filled with a CVD tungsten plug;

a plurality of digit lines formed on top of the interlevel dielectric layer, each digit line making electrical contact to each tungsten plug of a plurality of tungsten plugs; and an aspect ratio of at least about 2.5:1.

48. The access memory of claim 47, wherein the second dielectric material is selectively etchable with respect to the first dielectric material.

49. The access memory of claim 47, wherein each contact opening of the plurality of contact openings, except in the area of the junction, lined with a titanium metal layer contacting the titanium nitride layer, but not contacting the tungsten plug within the contact opening.

50. The access memory of claim 47, wherein each contact opening of said plurality of contact openings lined with a titanium metal layer contacting the titanium nitride layer, but not contacting the tungsten plug within the opening, the titanium metal layer overlying the titanium silicide layer in the area of the junction.

51. The access memory of claim 47, wherein each word line comprises a doped polycrystalline silicon lower portion and a refractory metal silicide portion above the lower portion.

52. The access memory of claim 47, wherein the aspect ratio is at least about 5:1.

* * * * *

UNITED STATES PATENT AND TRADEMARK OFFICE
CERTIFICATE OF CORRECTION

PATENT NO. : 6,812,512 B2  
APPLICATION NO. : 09/832272  
DATED : November 2, 2004  
INVENTOR(S) : Kirk Prall et al.

Page 1 of 1

It is certified that error appears in the above-identified patent and that said Letters Patent is hereby corrected as shown below:

On the title page:

Item (75) inventors: change "Gurtel Sandhu" to --Gurtej Sandhu--

Signed and Sealed this

Twenty-third Day of October, 2007

JON W. DUDAS  
*Director of the United States Patent and Trademark Office*